United States Patent
Fukazawa

(10) Patent No.: US 7,456,108 B2
(45) Date of Patent: Nov. 25, 2008

(54) MANUFACTURING METHOD FOR A SEMICONDUCTOR DEVICE

(75) Inventor: Motohiko Fukazawa, Toyota (JP)

(73) Assignee: Seiko Epson Corporation (JP)

( * ) Notice: Subject to any disclaimer, the term of this patent is extended or adjusted under 35 U.S.C. 154(b) by 31 days.

(21) Appl. No.: 11/453,311

(22) Filed: Jun. 14, 2006

(65) Prior Publication Data

US 2006/0284285 A1 Dec. 21, 2006

(30) Foreign Application Priority Data

Jun. 17, 2005 (JP) ............................. 2005-177495
Nov. 21, 2005 (JP) ............................. 2005-335459

(51) Int. Cl.
*H01L 21/311* (2006.01)
(52) U.S. Cl. ....................... 438/702; 438/719
(58) Field of Classification Search ................. 438/694, 438/700, 702, 706, 710, 719, 723; 216/67
See application file for complete search history.

(56) References Cited

U.S. PATENT DOCUMENTS

| | | | |
|---|---|---|---|
| 6,489,218 B1 * | 12/2002 | Kim et al. .................... | 438/460 |
| 7,052,975 B2 | 5/2006 | Koizumi | |
| 7,060,532 B2 | 6/2006 | Takyu et al. | |
| 7,183,136 B2 | 2/2007 | Hashimura et al. | |
| 2002/0013061 A1 * | 1/2002 | Siniaguine et al. .......... | 438/706 |
| 2004/0137653 A1 * | 7/2004 | Feldman et al. ............. | 438/22 |
| 2004/0229445 A1 * | 11/2004 | Suzuki et al. ............... | 438/459 |
| 2004/0245623 A1 | 12/2004 | Hara et al. | |
| 2004/0266051 A1 * | 12/2004 | Kojima et al. ................ | 438/57 |
| 2005/0070068 A1 * | 3/2005 | Kobayashi ................... | 438/401 |
| 2005/0200004 A1 | 9/2005 | Koizumi | |
| 2005/0250296 A1 * | 11/2005 | Yamamura et al. ........... | 438/460 |
| 2006/0138629 A1 * | 6/2006 | Fukazawa .................... | 257/686 |

FOREIGN PATENT DOCUMENTS

| | | |
|---|---|---|
| CN | 1273694 A | 11/2000 |
| JP | 2000-119552 | 4/2000 |
| JP | 2000-228389 | 8/2000 |
| JP | 2002-093752 | 3/2002 |
| JP | 2004-095952 | 3/2004 |
| JP | 2004-297019 | 10/2004 |

* cited by examiner

*Primary Examiner*—Kin-Chan Chen
(74) *Attorney, Agent, or Firm*—Harness, Dickey & Pierce, P.L.C.

(57) ABSTRACT

A manufacturing method for a semiconductor device, includes: preparing a semiconductor wafer having an active surface and a rear surface; forming a plurality of semiconductor regions, each of which having semiconductor elements formed on the active surface of the semiconductor wafer; forming cutting regions on the outer periphery of the semiconductor regions on the active surface of the semiconductor wafer; forming, on the cutting region, a first groove which does not penetrate the semiconductor wafer; forming, on the rear surface of the semiconductor wafer, a second groove which does not penetrate to the first groove in the position corresponding to the cutting region; decreasing a thickness of the semiconductor wafer, connecting the first groove and the second groove, and dividing each of the semiconductor regions from the semiconductor wafer by executing isotropic etching to the rear surface of the semiconductor wafer; and obtaining a plurality of individual semiconductor devices.

29 Claims, 11 Drawing Sheets

MANUFACTURING METHOD FOR A SEMICONDUCTOR DEVICE

CROSS-REFERENCE TO RELATED APPLICATION

This application claims priority to Japanese Patent application No. 2005-177495, filed Jun. 17, 2005, and Japanese Patent application No. 2005-335459, filed Nov. 21, 2005, the contents of which are incorporated herein by reference.

BACKGROUND

1. Technical Field

The present invention relates to the manufacturing method for a semiconductor device, a semiconductor device, a circuit substrate and an electronic device.

2. Related Art

In recent years, there has been a demand to miniaturize and reduce the weight of portable telephone devices, notebook portable computers and portable electronic devices such as a PDA (personal digital assistant) and the similar.

Accompanying the demand for miniaturization and weight reduction, there has also been demand to limit the packaging space for each type of electronic product, such as semiconductor devices and the similar, provided within the electronic devices, as well as to miniaturize packaged electronic products.

Given this background, in order to accomplish the corresponding to the miniaturization of electronic products, high-density packaging (three-dimensional packaging) which accomplishes multi-layering of semiconductor devices, as well as the thinning processing of the electronic products themselves has been widely performed.

Generally, in thinning the semiconductor devices, as back grind processing, semiconductor wafers have been thinned by grinding and polishing the reverse side surface (rear surface) of the semiconductor wafer circuit forming surface.

Subsequently, during dicing processing, a plurality of thinned semiconductor devices can be manufactured by dividing semiconductor wafers for each semiconductor region formed on the semiconductor wafer circuit forming surface.

However, in the above described manufacturing method, damaged layers having minute fissures (cracks) are formed on the rear surface of the semiconductor wafer, caused by back grind processing.

Furthermore, there has been the problem in that, if the semiconductor rear surface damaged layer is left in its existent state, and if the manufacturing of the semiconductor device is continued, beginning with cracking of the damaged layer, the semiconductor element becomes completely broken.

Furthermore, there has been the problem in that, during dicing processing, in order to mechanically remove the semiconductor wafer by bevel cutting and the similar, minute cracking and chipping and the similar has been generated in the area of the cut surface of the semiconductor wafer.

In addition, since the semiconductor wafer is thin, there has been the problem of excessive stress on the portions in which cracking, chipping and the similar are generated.

In order to resolve the generation of such problems during the back grinding and dicing processes, the following methods are proposed.

(1) With the method disclosed in Japanese Unexamined Patent Application First Publication No. 2000-228389, in a state in which a tape member pasted to the surface of a wafer on which a circuit is formed, the rear surface of the wafer is polished, and wafer thinning is performed by plasma etching the rear surface of the polished wafer.

According to this method, the damaged layer can be removed by wet etching the rear surface of the wafer.

(2) With the method disclosed in Japanese Unexamined Patent Application First Publication No. 2002-93752, after testing the semiconductor wafer, attaching dicing tape to the rear surface of the semiconductor wafer via a carrier frame, and accomplishing semi-full dicing from the element forming surface on the semiconductor wafer, the dicing tape is exfoliated.

Continuing, after attaching etching resistant film to the element forming surface of the semiconductor wafer via the carrier frame, the semiconductor wafer is immersed in an etching solution, and the semiconductor wafer thinning is executed.

According to this method, the polishing of semiconductor wafer rear surfaces, the forming of the piece semiconductor devices by dividing the semiconductor wafers, and the removing of the affected and damaged layers (damaged regions) generated on the cut surface by semi-full dicing processing can be simultaneously performed.

However, in the above disclosed method, there are the following problems.

(1) In the method disclosed in Unexamined Japanese Unexamined Patent Application First Publication No. 2000-228389, there has been the problem in that, order to remove the damaged layer formed on the semiconductor wafer rear surface by grinding and polishing through plasma etching, a longer time is required than with other etching methods.

(2) In the method disclosed in Japanese Unexamined Patent Application First Publication No. 2002-93752, there has been difficulty in handling the wafer to accomplish semi (full) dicing after thin processing the semiconductor wafer.

(3) Furthermore, in the above described method, when thinning the semiconductor device, stress easily concentrates in end portions of the semiconductor device, and the semiconductor device is damaged and broken.

SUMMARY

An advantage of some aspects of the invention is to provide a manufacturing method for a semiconductor device, a semiconductor device, a circuit substrate and electronic device, which can efficiently remove a chipped or damaged layer in the manufacturing process for a semiconductor device, and which can suppress damage caused by the stress concentration at the time of thinning the semiconductor wafer.

A first aspect of the invention provides a manufacturing method for a semiconductor device, includes: preparing a semiconductor wafer having an active surface and a rear surface on an opposite side of the active surface; forming a plurality of semiconductor regions, each of which having semiconductor elements formed on the active surface of the semiconductor wafer; forming cutting regions on the outer periphery of the semiconductor regions on the active surface of the semiconductor wafer; forming, on the cutting region, a first groove which does not penetrate the semiconductor wafer; forming, on the rear surface of the semiconductor wafer, a second groove which does not penetrate to the first groove in the position corresponding to the cutting region; decreasing a thickness of the semiconductor wafer, connecting the first groove and the second groove, and dividing each of the semiconductor regions from the semiconductor wafer by executing isotropic etching to the rear surface of the semiconductor wafer; and obtaining a plurality of individual semiconductor devices.

According to the first aspect of the invention, by executing the isotropic etching, the semiconductor wafer material is removed between the first and second groove, the second groove and the first groove are connected, and the semiconductor wafer is performed dividing (dicing) for each of the semiconductor regions, thereby obtaining the individual semiconductor devices.

Through the executing the isotropic etching, the corner portion (the periphery of the rear surface of the semiconductor device) including the end of the cut surface of the semiconductor wafer (side surface of the semiconductor device) and the end of the rear surface of the semiconductor device are formed into a rounded portion, mitigating the stress concentration generated on the periphery of the semiconductor device, and suppressing damage to the device.

In addition, because the rear surface of the semiconductor wafer is removed by isotropic etching, the semiconductor device can be made thin.

A second aspect of the invention provides a manufacturing method for a semiconductor device, includes: preparing a semiconductor wafer having an active surface and a rear surface on an opposite side of the active surface; forming a plurality of semiconductor regions, each of which having semiconductor elements formed on the active surface of the semiconductor wafer; forming cutting regions on the outer periphery of the semiconductor regions on the active surface of the semiconductor wafer; forming, on the cutting region, a first groove which does not penetrate the semiconductor wafer; forming a resin layer by filling resin into the first groove; forming, on the rear surface of the semiconductor wafer, a second groove which does not penetrate to the first groove in the position corresponding to the cutting region; decreasing a thickness of the semiconductor wafer and exposing the resin layer by executing isotropic etching to the rear surface of the semiconductor wafer; dividing each of the semiconductor regions from the semiconductor wafer by cutting the resin layer from the second groove; and obtaining a plurality of individual semiconductor devices.

According to the second aspect of the invention, spin etching is executed as the form of isotropic etching from the rear surface of the semiconductor wafer, with the material of the semiconductor wafer forming a solution between the second groove and the first groove, connecting the second groove to the first groove.

Since the resin layer is formed in the first groove formed on the active surface of a semiconductor wafer, if the second groove and the first groove are connected, the resin layer is exposed, suspending the resin layer etching of the first groove.

With such a resin layer, circulation of etching liquid on the active surface of a semiconductor wafer is prevented, protecting the semiconductor element formed on the active surface of the semiconductor wafer.

In addition, when dry etching is executed as the form of isotropic etching from the rear surface of the semiconductor wafer, after connecting the second groove to the first groove, etching of the first groove is suspended by the resin layer formed on the first groove.

With such a resin layer, circulation of etching gas on the active surface of the semiconductor wafer is prevented, protecting the semiconductor element formed on the active surface of the semiconductor wafer.

It is preferable that the manufacturing method for the semiconductor device of the first aspect of the invention and the second aspect of the invention further include: facing the active surface of the semiconductor wafer and a support member supporting the semiconductor wafer after the forming of the first groove; and connecting the active surface of the semiconductor and the support member via an adhesive layer.

According to this method, in addition to being supported by a support member, the active surface of the semiconductor wafer is protected by an adhesive layer.

Furthermore, warping of the semiconductor wafer is suppressed, enabling the efficient handling of the thinned semiconductor wafer.

It is preferable that, in the manufacturing method for the semiconductor device of the first aspect of the invention and the second aspect of the invention, the adhesive layer be formed from material which be cured by irradiation of ultraviolet rays.

According to this method, by irradiating ultraviolet rays onto the adhesive layer, the semiconductor wafer can be easily affixed to the support member.

It is preferable that, in the manufacturing method for the semiconductor device of the first aspect of the invention and the second aspect of the invention, the adhesive layer be formed from material which be caused to foam (gas generation) by irradiation of ultraviolet rays.

According to this method, by irradiating ultraviolet rays onto the adhesive layer, foam is produced, generating interface exfoliation to easily exfoliate the semiconductor wafer from the support member.

It is preferable that, in the manufacturing method for the semiconductor device of the first aspect of the invention and the second aspect of the invention, the adhesive layer be formed from material which be caused to foam by heating.

According to this method, by heating and producing foam in the adhesive layer, interface exfoliation is generated to easily exfoliate the semiconductor wafer from the support member.

It is preferable that, in the manufacturing method for the semiconductor device of the first aspect of the invention and the second aspect of the invention, the adhesive layer be formed from resin material which be soluble in a solvent.

According to the first aspect of the invention and the second aspect of the invention, through the dissolution of the adhesive layer in a specific solvent, the semiconductor wafer can be easily exfoliated from the support member.

It is preferable that, in the manufacturing method for the semiconductor device of the first aspect of the invention and the second aspect of the invention, the support member be formed from material transmitted by ultraviolet rays.

In this instance, as the adhesive layer which attaches the semiconductor wafer to the support member, use is desirably made, for example, of an adhesive of which the viscosity is reduced and which is cured by ultraviolet rays.

According to the first aspect of the invention and the second aspect of the invention, since the support member transmits ultraviolet rays, by irradiating ultraviolet rays onto the adhesive layer from the support member side, the viscosity of the adhesive layer is reduced, enabling easy exfoliation of the semiconductor wafer from the support member.

By this means, individual diced semiconductor devices can be easily created.

It is preferable that the manufacturing method for the semiconductor device of the first aspect of the invention and the second aspect of the invention further include: executing back grinding to the rear surface of the semiconductor wafer after the forming of the first groove.

Generally, after thinning a semiconductor wafer by means of back grinding, if a second groove is formed by dicing the rear surface of the semiconductor wafer, then cracks (a damaged layer) are formed on the rear surface of the semiconductor wafer and the inner wall surface of the second groove.

In the first aspect of the invention and the second aspect of the invention, since the isotropic etching is performed to the rear surface of the semiconductor wafer after the forming of the second groove, the cracks (damaged layer), chips and the similar that is formed at the time of dicing processing and back grind processing on the rear surface of the semiconductor wafer, can be removed at same process (the isotropic etching process).

By this means, in addition to improving the strength of the semiconductor device, the semiconductor wafer can be thinned.

It is preferable that, in the manufacturing method for the semiconductor device of the first aspect of the invention and the second aspect of the invention, the isotropic etching be spin etching in which etching liquid be dripped onto the rear surface of the semiconductor wafer while rotating the semiconductor wafer.

According to this method, the etching liquid can be uniformly coated onto the rear surface of the semiconductor wafer, enabling uniform thinning of the semiconductor wafer.

In addition, since spin etching is wet etching, the etching speed is fast in comparison with etching a semiconductor wafer by means of plasma etching.

It is preferable that, in the manufacturing method for the semiconductor device of the first aspect of the invention and the second aspect of the invention, the isotropic etching be dry etching.

According to this method, uniform thinning can be performed of the semiconductor wafer.

It is preferable that, in the manufacturing method for the semiconductor device of the first aspect of the invention and the second aspect of the invention, a width of the second groove be narrower than a width of the first groove.

The second groove formed on the rear surface of the semiconductor wafer is formed in a position opposite to that of the first groove formed on the active surface of the semiconductor wafer.

In this instance, if the semiconductor wafer is viewed from the perpendicular direction, the second groove formation region overlays the first groove formation region, and the second groove formation region is included within the first groove formation region.

Furthermore, even if the center of the second groove is slightly sifted from the center of the first groove, the formation region of the second groove will be within the formation region of the first groove, and highly precise position determination accuracy is unnecessary to make the easily formed second groove.

According to this method, In the dicing processing, since it would be well to align the position of the dicing blade and the position of the irradiation area within the parameters of the width of the first groove, slight slippage of the position is allowable, making accurate position alignment easy when forming the second groove, it is possible to realize improved dicing accuracy.

Moreover, with the first aspect of the invention and the second aspect of the invention, the width of the first and second grooves has reference to the direction perpendicular to the direction cutting the dicing blade of the first groove and the second groove, and the direction perpendicular to the direction of laser irradiation of the first groove and the second groove.

It is preferable that, in the manufacturing method for the semiconductor device of the first aspect of the invention and the second aspect of the invention, the first groove and second groove be formed by using a dicing blade of which end is tapered.

According to this method, by forming the first and second grooves using a dicing blade which has a tapered blade, the shape of the first and second grooves is also made to be tapered, corresponding to the shape of the end of the dicing blade.

By etching the tapered the first groove and the second groove, the corner portion of the semiconductor device can be easily curved in comparison to when use is made of a dicing blade having the end which is rectangular or circular.

By this means, since a rounded portion can be easily formed on the periphery of the rear surface of the semiconductor device, stress concentration on the periphery of the semiconductor device can be mitigated, improving the transverse strength of and suppressing damage to the semiconductor device.

It is preferable that, in the manufacturing method for the semiconductor device of the first aspect of the invention and the second aspect of the invention, the first groove and second groove be formed by irradiating the semiconductor wafer with a laser.

According to this method, it is possible to improve rapid processing speed in comparison to that of blade dicing.

A third aspect of the invention provides a manufacturing method for a semiconductor device, includes: preparing a semiconductor wafer having an active surface and a rear surface on an opposite side of the active surface; forming a plurality of semiconductor regions, each of which having semiconductor elements formed on the active surface of the semiconductor wafer; forming cutting regions on the outer periphery of the semiconductor regions on the active surface of the semiconductor wafer; forming, on the cutting region, a groove which does not penetrate the semiconductor wafer; decreasing a thickness of the semiconductor wafer and dividing each of the semiconductor regions from the semiconductor wafer by executing isotropic etching to the rear surface of the semiconductor wafer; and obtaining a plurality of individual semiconductor devices.

This method is applied to cases in which TEG (Test Element Groups) test patterns are not formed on the semiconductor wafer in the cutting regions between a plurality of semiconductor regions.

According to the third aspect of the invention, since it is unnecessary to cut a TEG pattern, it is possible to omit the process of forming the groove, and it is possible to realize simplifying the manufacturing process.

It is preferable that, in the manufacturing method for the semiconductor device of the third aspect of the invention, the groove be formed by using a dicing blade of which the end be tapered.

According to this method, by forming the groove using a dicing blade which has a tapered blade, the shape of the groove is also made to be tapered, corresponding to the shape of the end of the dicing blade.

By etching the tapered the groove, in comparison to when use is made of a dicing blade having the end which is rectangular or circular, the corner portion of the semiconductor device can be easily curved.

By this means, since the rounded portion on the periphery of the rear surface of the semiconductor device is easily formed, the stress concentration toward the periphery of the semiconductor device can be mitigated, improving the transverse strength of and suppressing damage to the semiconductor device.

It is preferable that, in the manufacturing method for the semiconductor device of the third aspect of the invention, the groove be formed by irradiating the semiconductor wafer with a laser.

According to this method, the processing speed is improved in comparison to the speed of blade dicing.

A fourth aspect of the invention provides a semiconductor device includes: an active surface on which semiconductor elements are formed; a rear surface on the opposite side of the active surface; a side surface; and a rounded portion formed between the rear surface and the side surface.

According to this composition, since the rounded portion (periphery of the rear surface) is formed by the rear surface of the semiconductor device and the side surface, the stress concentration on the periphery of the semiconductor device can be mitigated.

It is possible to improve the strength of the thinned semiconductor device.

It is preferable that the semiconductor device of the fourth aspect of the invention further include: a rounded portion formed between the active surface and the side surface.

According to this composition, since the corner portion (periphery of the active surface) is curved, and the rounded portion is formed, the stress concentration on the periphery of the semiconductor device can be mitigated.

It is possible to improve the strength of the thinned semiconductor device.

A fifth aspect of the invention provides a circuit substrate includes: the above described semiconductor device.

As indicated above, if the width of the second groove is narrower than the width of the first groove, then a level difference portion is formed on the periphery of the active surface.

According to the fifth aspect of the invention, when the semiconductor device is packaged (in the face down format) onto the circuit substrate via an adhesive layer, the adhesive is arranged to a region on which the level difference portion is formed.

An amount of the adhesive formed on the region on which the level difference portion is formed, is greater than an amount of the adhesive formed on the other regions.

By this means, adhesive properties between the semiconductor device and the circuit substrate can be increased, with improved reliability.

A sixth aspect of the invention provides an electronic device includes: a semiconductor device manufactured by the above described manufacturing method for the semiconductor device.

According to the electronic device of the sixth aspect of the invention, since a semiconductor device having the improved strength and thinning referred to above is included, it is possible to realize the electronic having the improved reliability and miniaturization.

DESCRIPTION OF EXEMPLARY EMBODIMENTS

Embodiments of the invention are explained hereafter, with reference to the drawings.

Moreover, in each drawing used in the following explanations, in order to establish the recognition capable size of each member, the reduction scale of each member is appropriately changed.

First Embodiment

Semiconductor Wafer

First of all, an explanation is provided concerning the semiconductor wafer before the individualizing of the semiconductor devices.

Figure 1:
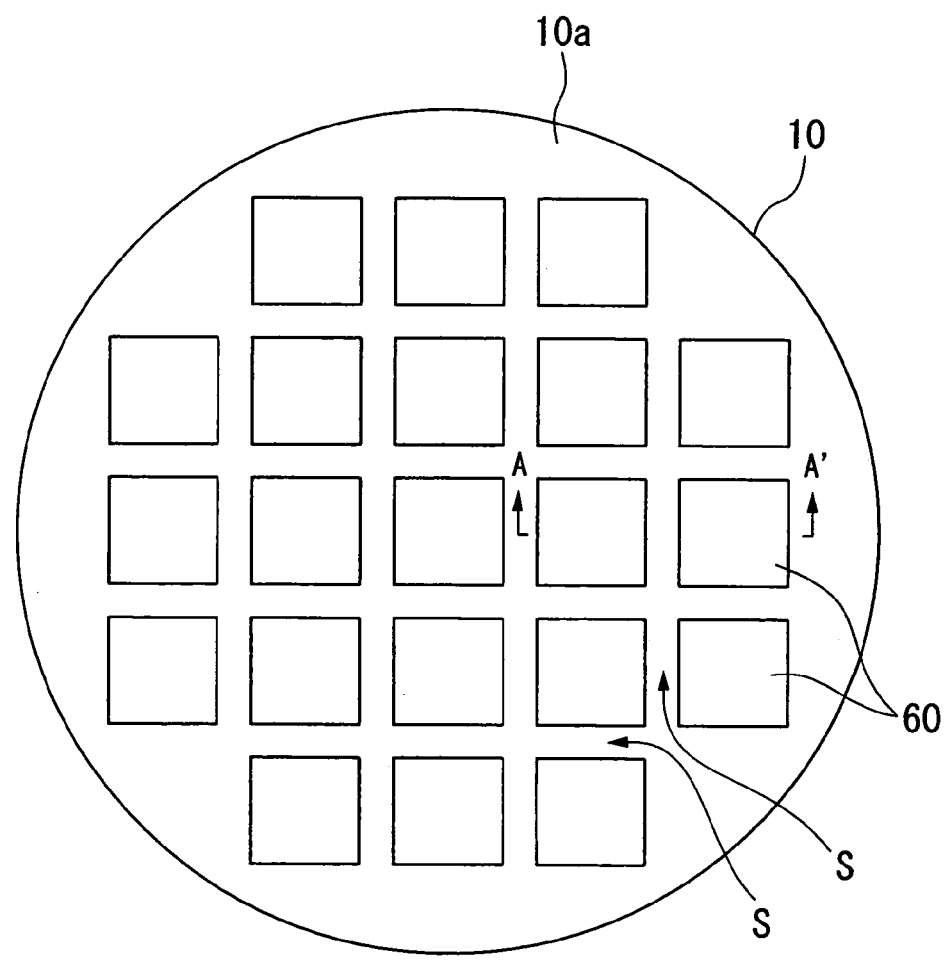
FIG. 1 is a plan view that schematically shows a semiconductor wafer on which semiconductor regions are formed.

FIG. 1 is a plan view that schematically shows the semiconductor wafer 10 on which a plurality of semiconductor regions 60 is formed.

Semiconductor wafer 10 is formed from silicon material on which is formed semiconductor regions 60.

On the active surface 110a of the semiconductor wafer 1 is formed an accumulation circuit (integrated circuit) including a transistor, memory element and other semiconductor elements for each of the semiconductor regions 60.

In the first embodiment, the semiconductor region 60 is a region which becomes a semiconductor device by below described manufacturing method, and means a region formed on a semiconductor wafer before the individualizing of the semiconductor devices.

The semiconductor element is not formed on the rear surface 10b of the opposite side of the active surface 10a of the semiconductor wafer 10.

In addition, as shown in FIG. 1, in an area between the closely proximate semiconductor regions 60 is a cutting region S.

A TEG is formed on the cutting region S, for measuring the electrical characteristics of the switching element of the semiconductor element.

Moreover, since the TEG is cut at the time of dicing the semiconductor wafer, there is no electrical influence sustained by other semiconductor elements.

Manufacturing Method for Semiconductor Device

Next, an explanation is provided of a manufacturing method for a semiconductor device.

FIGS. 2A to 3D are cross-sectional views that show the process of manufacturing semiconductor device 61 including dividing the semiconductor wafer 10 into each of the semiconductor regions 60 and individualizing the semiconductor regions 60.

Protruding Electrode Forming Process

Figure 2A:
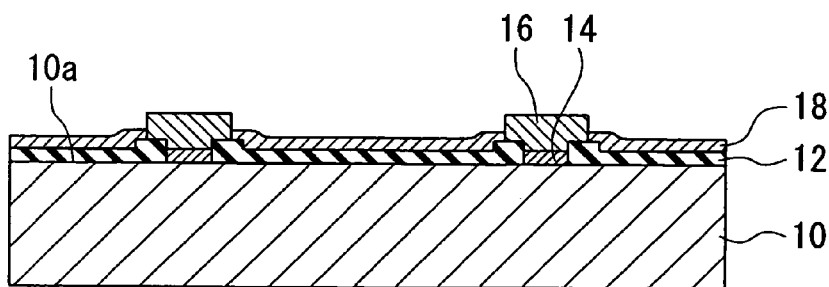
FIGS. 2A to 2C are cross-sectional views that show the manufacturing process of the semiconductor device according to the first embodiment.

As shown in FIG. 2A, a semiconductor wafer 10 in which a semiconductor element is formed on the active surface 10a, is prepared.

Next, on the entire surface of the active surface 10a of the semiconductor wafer 10, a metallic film is formed from a metallic material including aluminum (Al) and the similar by sputtering method.

Next, a resist is coated onto the entire surface of the metallic film.

Next, exposure and development processing is executed on the resist coated on the entire surface of the metallic film, and the resist is patterned into a specific shape.

Next, by using the patterned resist serving as a mask, the metallic film is etched, and an electrode pad 14 is formed, as shown in FIG. 2A.

Next, an insulation layer formed from silicon oxide ($SiO_2$) is formed by the CVD (chemical vapor deposition) method and the heat oxidation method on the entire surface of the active surface 10a of the semiconductor wafer 10, which includes the electrode pad 14.

Next, a resist is coated on the insulation layer.

Next, exposure and development processing is executed on the resist coated on the entire surface of insulation layer, and the resist is patterned into a specific shape.

Next, by using the patterned resist as a mask, the insulation layer is etched, and an insulation layer 12 is formed as shown in FIG. 2A.

The insulation layer 12 is formed on the entire surface of the semiconductor wafer 10, while exposing the upper surface of the electrode pad 14.

Next, a protective resin layer 18 is formed so as to expose the electrode pad 14 on the insulation layer 12.

Next, as shown in FIG. 2A, the resist is coated on the active surface 10a of the semiconductor wafer 10.

Next, the resist coated on the entire surface of the active surface 10a is exposure processed, by using an open mask opening only the part on which the protruding electrode 16 is formed, followed by development processing.

The resist is patterned.

Subsequently, removal of the resist is performed after copper (Cu) electrolytic plate processing.

By this means, a protruding electrode 16 is formed on the electrode pad 14.

First Groove Forming Process

Figure 2B:
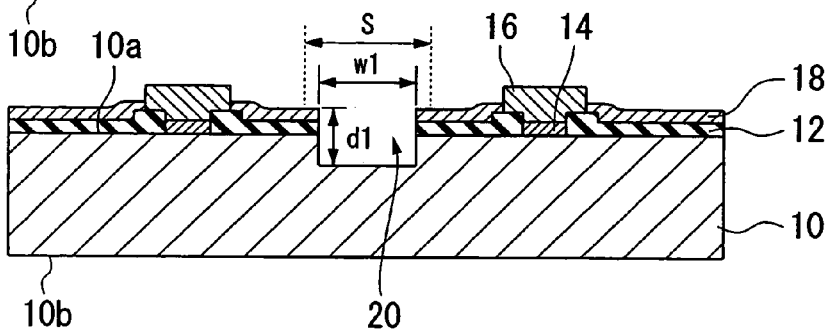

Next, as shown in FIG. 2B, a cutting region S formed on the periphery of the semiconductor region 60 of the active surface 10a of the semiconductor wafer 10, is diced by using a dicing blade or laser (not shown).

The depth d1 at which dicing is performed on the cutting region S, is a depth at which the semiconductor wafer 10 is not penetrated.

The dicing depth d1 is set, for example, to 25 μm.

In addition, the dicing blade uses a blade width of, for example 50 μm.

By this means, the depth d1 in the cutting region S of the active surface 10a of the semiconductor wafer 10 is 25 μm, and a first groove 20 is formed in which the width w1 is 50 μm.

In FIG. 1, the first groove 20 is formed in a lattice shape so as to partition the external periphery of the semiconductor region 60 of the semiconductor wafer 10.

In addition, in the case of dicing by using a laser, the irradiation area is changed relative to the width of the blade.

Connecting Process for Semiconductor Wafer And Glass Substrate

Figure 2C:
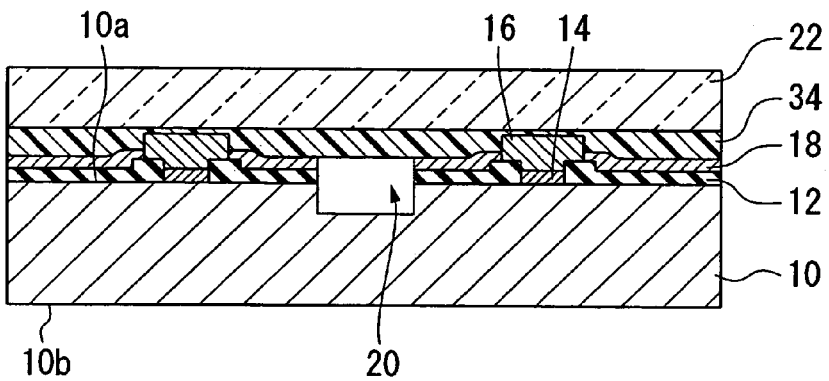

Next, as shown in FIG. 2C, a glass substrate 22 (support member) made of transparent material is prepared.

Subsequently, the semiconductor wafer 10 is arranged on the lower side, and adhesive is arranged and an adhesive layer 34 is formed on the active surface of semiconductor wafer 10.

Moreover, adhesive layer 34 may also be arranged on the surface of the glass substrate 22 facing the active surface 10a.

In this instance, as the glass substrate 22, a part of a so-called WSS (Wafer Support System) may be used.

As the adhesive layer 34, an ultraviolet ray reaction type resin material which is cured by the irradiation of ultraviolet rays (UV light), may be used.

As the ultraviolet ray curable resin, for example, of epoxy resin or acrylic resin may be used.

Subsequently, the facing surface (surface facing the active surface 10a) of the glass substrate 22 forming a support body and the active surface 10a of the semiconductor wafer 10, are connected together via the adhesive layer 34.

By this means, the active surface 10a of the semiconductor wafer 10 can be supported by a glass substrate 22, and is protected by adhesive layer 34.

Furthermore, camber of the semiconductor wafer 10 is suppressed, and handling of the thinned semiconductor wafer 10 can be efficiently performed.

In addition, back grinding can be stably accomplished.

Moreover, as the adhesive layer 34, other than the ultraviolet ray curable resin referred to above, material which foams (generates gas) by heating or material which foams (generates gas) by the irradiation of ultraviolet rays, may be used.

In addition, the adhesive layer 34 may also dissolve alcohols compatible with water, methanol, and ethanol and the similar in organic and inorganic solvents.

Back Grinding Process

Figure 3A:
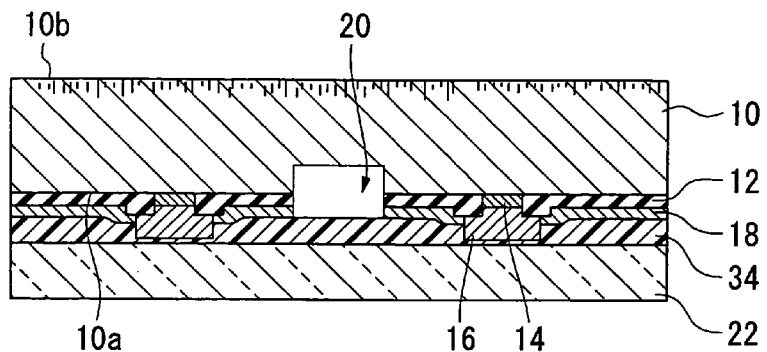
FIGS. 3A to 3D are cross-sectional views that show the manufacturing process of the semiconductor device according to the first embodiment.

Next, as shown in FIG. 3A, a semiconductor wafer 10 connected to a glass substrate 22 by an adhesive layer 34 inversely rotates vertically, and the semiconductor 10 is arranged on the upper side.

Subsequently, back grinding is performed to the rear surface 10b of the semiconductor wafer 10.

By the back grind processing, the thickness of the semiconductor wafer 10 is ground to become a specified thickness.

Specifically, grinding members such as grind stones and the similar are brought into contact with the rear surface 10b of the semiconductor wafer 10, and mechanical processing is performed of the rear surface 10b of the semiconductor wafer 10 by rotation relative to the semiconductor wafer 10.

At this time, in the back grinding process, minute cracking is produced on the rear surface of the polished and ground semiconductor wafer 10, and a damaged layer (20-30 μm) is formed on the rear surface 10b of the semiconductor wafer 10, as shown in FIG. 3A.

In the first embodiment, the damaged layer formed on the rear surface 10b of the semiconductor wafer 10 is removed by etching processing.

Therefore, in background processing, the semiconductor wafer 10 is ground so as to obtain to a thickness of 80 μm, to which has been added the thickness of the damaged layer in the finally obtained semiconductor wafer 10.

Second Groove Forming Process

Figure 3B:
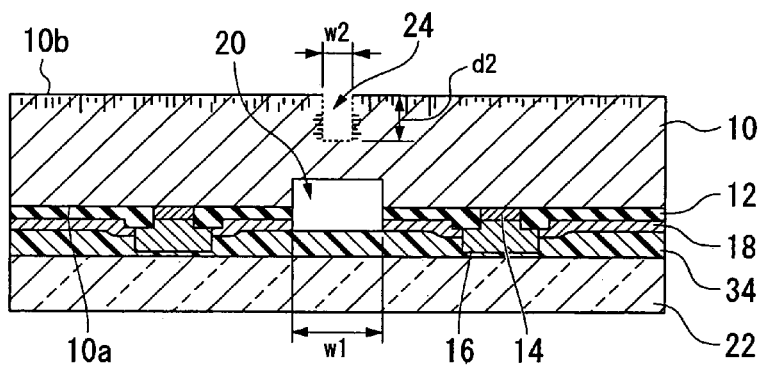

Next, as shown in FIG. 3B, dicing is performed on the position of the rear surface 10b corresponding to the first groove 20 formed on the active surface 10a of the semiconductor wafer 10, by using a dicing blade (not shown).

A second groove 24 is formed on the rear surface 10b and on opposite side of the first groove 20.

Here, the position of the corresponding rear surface 10b, in the case in which the semiconductor wafer 10 is seen from the perpendicular direction, has reference to a layered second groove 24 formation region and a first groove 20 formation region.

In the second groove forming process, a dicing blade having a width which is shorter than the width w1 of the first groove 20, is used.

Furthermore, second groove forming processing is performed by conversion to a narrower blade width (for example 30 μm) than the dicing blade used at the time of forming the first groove 20, or in other words a dicing blade width which is shorter than the width w1 of the first groove 20.

In this instance, after positionally aligning the dicing blade on the rear surface 10b to within the parameters of the width w1 of the first groove 20, dicing is performed of the rear surface 10b of the semiconductor wafer 10 at a depth which does not reach the bottom surface of the first groove 20.

In this manner, in the second groove forming process, since it would be well if the dicing blade is positionally aligned within the parameters of the width w1 of the first groove 20, slight positional slippage is allowed.

Furthermore, since highly precise positional alignment is not required when forming the second groove 24, the second groove 24 can be easily formed.

By this means, in the forming of the second groove 24 in which, for example, the depth d2 is 20 μm and the width w2 is 30 μm on the rear surface 10b of the semiconductor wafer 10, cracks such as those shown in FIG. 3B are formed on the inner wall surface of the second groove 24.

In this instance, the width w2 of the second groove 24 formed on the rear surface 10b of the semiconductor wafer 10 is narrower than the width w1 of the first groove 20 formed on the active surface 10a of the semiconductor wafer 10.

Moreover, the dicing may also be performed with a dicing blade having the same width as the first groove 20 and the second groove 24, so that the width w1 of the first groove 20 and the width w2 of the second groove 24 are uniform.

In addition, dicing performed by a laser is performed with the irradiation area being changed relative to the size of the blade width.

Isotropic Etching Process

Figure 3C:
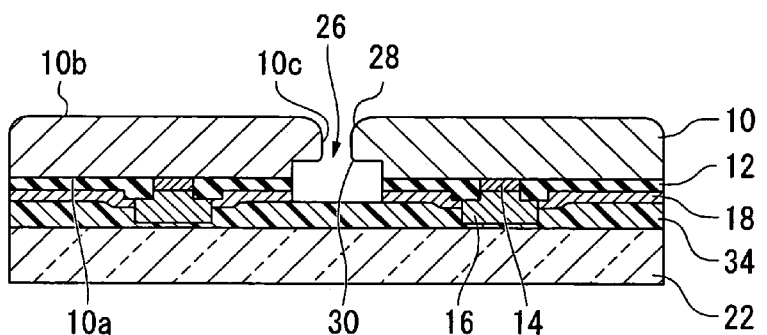

Next, as shown in FIG. 3C, wet etching (isotropic etching) is executed from the rear surface 10b of the semiconductor wafer 10.

By this means, etching the damaged layer formed on the rear surface 10b of the semiconductor wafer 10, and etching the inner wall surface (including the damaged layer) of the second groove 24, are simultaneous performed.

As the wet etching method, the spin etching method is adopted.

Specifically, etching liquid formed from a mixture of, for example, hydrofluoric acid and nitric acid is dripped onto the rear surface 10b of the semiconductor wafer 10 while rotating the semiconductor wafer 10.

Thereby etching the rear surface 10b including the inner wall surface of the second groove 24 of the semiconductor wafer 10 is performed. The cracked damaged layer is removed.

In addition, if the etching proceeds, the material of the semiconductor wafer 10 between the first groove 20 and the second groove 24 is removed, and the bottom surface of the second groove 24 reaches the bottom surface of the first groove 20, a penetrating hole 26 connecting the first groove 20 and the second groove 24 is formed.

By this means, the semiconductor wafer 10 is thinned, the thickness of the semiconductor wafer 10 is decreased to 50 μm, the semiconductor wafer 10 is diced along the cutting region S, each of the semiconductor regions 60 is divided, and individual semiconductor devices are formed.

In addition, by using the isotropic etching, a rounded portion 28 is formed in the corner portion (aperture entry angle of penetrating hole 26) including an end of the rear surface 10b of the semiconductor wafer 10 and an end of the cut surface 10c of the penetrating hole 26.

Furthermore, a rounded portion 30 is formed by circulating etching liquid in the corner potion formed by cut surface 10c of the penetrating hole 26 and the bottom surface of the first groove 20.

Moreover, in the isotropic etching process, a dry etching (isotropic etching and the similar) method may be adopted. In this case, etching the damaged layer formed in the rear surface 10b of the semiconductor wafer 10, and etching the inner wall surface (including the damaged layer) of the second groove 24 are simultaneously performed.

In the case of dry etching, fluorine gas is used, etching is performed to the rear surface 10b of the semiconductor wafer 10 including the inner wall surface of the second groove 24 of the semiconductor wafer 10, and the cracked damaged layer is removed.

As etching progresses, the material of the semiconductor wafer 10 between the first groove 20 and the second groove 24 is etched, the bottom surface of the second groove 24 reaches the bottom surface of the first groove 20, a penetrating hole 26 connecting the first groove 20 and the second groove 24 is formed.

By this means, the semiconductor wafer 10 is thinned, the thickness of the semiconductor wafer 10 is decreased to 50 μm, the semiconductor wafer 10 is diced along the cutting region S, each of the semiconductor regions 60 is divided, and individual semiconductor devices are formed.

In addition, in the case of executing dry etching as the isotropic etching, a rounded portion 28 is formed in the corner portion (aperture entry angle of the penetrating hole 26) including the end of the rear surface 10b of the semiconductor wafer 10 and the end of the cut surface 10c of the penetrating hole 26.

Furthermore, a rounded portion 30 is formed by circulating etching gas or plasma in the corner portion including the end of the cut surface 10c of the penetrating hole 26 and the end of the bottom surface of the first groove 20.

Exfoliation Process

Figure 3D:
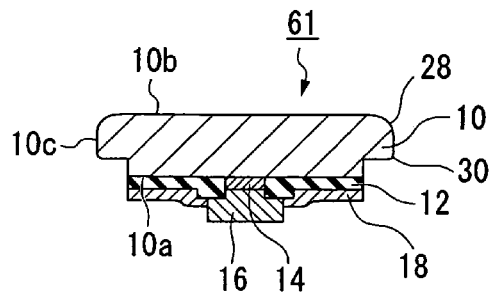

Next, as shown in FIG. 3D, by radiating ultraviolet rays onto the adhesive layer 34 so as to transmit the glass substrate 22, interface exfoliation is generated in the adhesive layer 34, separating the semiconductor wafer 10 and the glass substrate 22.

Thereby individual semiconductor devices 61 are obtained.

According to the first embodiment, a second groove 24 is formed by dicing the rear surface 10b of the semiconductor wafer 10, and isotropic etching is executed on the rear surface 10b of the semiconductor wafer 10 after thinning the semiconductor wafer 10 by performing the back grinding.

Therefore, removing the cracks (damaged layer) and chips and the similar generated on the rear surface 10b of the semiconductor wafer 10 at the time of dicing and back grind processing, thinning of the semiconductor wafer 10 can also be simultaneously performed.

Therefore, it is possible to realize the semiconductor device 61 strengthening.

In addition, since semiconductor regions 60 formed in the semiconductor wafer 10 are divided (cross-cut) by using the isotropic etching (spin etching or dry etching), the rounded portion 28 including the end of the cut surface of the semiconductor wafer 10 and at the end of the rear surface 10b of the semiconductor wafer 10 is formed.

By this means, stress concentration on the periphery of the semiconductor device 61 is mitigated, and the damaging to the semiconductor device 61 is suppressed.

Moreover, the shape of the rounded portion 28 can be adjusted by controlling the etching processing time.

For example, if the etching processing time is extended, the rounded portion 28 takes on a more circular shape, whereas if the etching processing time is shortened, the rounded portion 28 is more angular.

In addition, according to the first embodiment, since isotropic etching is spin etching, the etching liquid can be uniformly coated relative to the rear surface 10b of the semiconductor wafer 10, which can be uniformly thinned.

In addition, since spin etching is wet etching, the etching speed is faster in comparison to when the semiconductor wafer 10 is etched by using the plasma etching, and the manufacturing time of the semiconductor device 61 can be shortened.

Semiconductor Device

Next, an explanation is provided of the semiconductor device manufactured by the semiconductor device manufacturing method of the first embodiment.

Figure 4A:
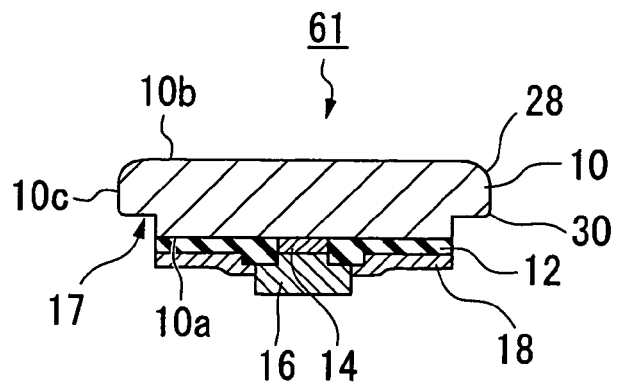
FIG. 4A is a cross-sectional view that schematically shows a semiconductor device.

FIG. 4A is a cross-sectional view that schematically explains the semiconductor device 61.

As shown in FIG. 4A, semiconductor device 61 includes a semiconductor element (not shown) having an accumulation circuit formed from a transistor, memory element, or other electronic element formed on the active surface 10a of a silicon base body 10.

A protruding electrode 16 and the similar are formed on the semiconductor element.

As shown in FIG. 4A, the corner portion (periphery of the rear surface 10b of the semiconductor device 61) including the end of the rear surface 10b of the semiconductor device 61 and the end of the side surface 10c, is etched by above mentioned wet etching.

Therefore, a rounded portion 28 is formed on the corner portion.

In addition, the semiconductor device 61 of the first embodiment is manufactured by forming a first groove 20 in the active surface 10a of the semiconductor wafer 10 at the time of dicing the semiconductor wafer 10, and by forming a second groove 24 on the rear surface 10b of the semiconductor wafer 10, forming the width of the second groove 24 narrower than the width of the first groove 20, the first groove 20 and the second groove 24 are subsequently constructed so as to be connected by spin etching.

Therefore, as shown in FIG. 4A, in the periphery of the active surface 10a of the semiconductor device 61, since the width of the first groove 20 and the width of the second groove 24 are different, a level difference portion 17 is formed.

In addition, as described above, the corner portion (periphery of the active surface 10a of the semiconductor device 61) including the end of the active surface 10a of the level difference portion 17 and the end of the side surface 10c (cut surface), is etched by the circulation of etching liquid after the second groove 24 and the first groove 20 are connected.

Therefore, the rounded portion 30 is formed on the corner portion.

Moreover, the shape of the level difference portion 17 is adjusted by changing the width of the first groove 20 and the second groove 24.

Figure 4B:
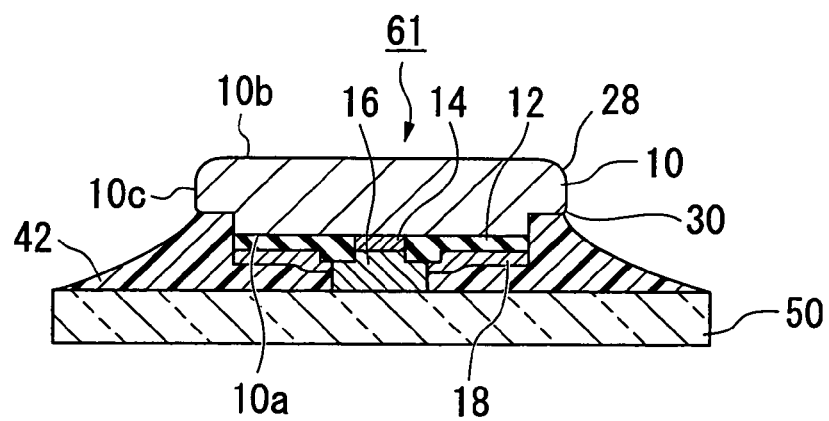
FIG. 4B is a cross-sectional view that schematically shows a semiconductor device packaged on a substrate.

FIG. 4B is a cross-sectional view that shows the circuit substrate 50 on which the semiconductor device 61 of this embodiment is packaged.

As shown in FIG. 4B, the semiconductor device 61 including rounded portions 28 and 30 formed on the active surface 10a and the rear surface 10b, faces to the circuit substrate 50 while the active surface 10a is downward (face down) to the circuit substrate 50, and is packaged to the circuit substrate 50 via an anisotropic conductive film (ACP: anisotropic conductive paste) 42 and the similar.

As adhesive other than ACP, an insulating resin materials including anisotropic conductive film (ACF: anisotropic conductive film), non-conductive film (NCF: Non-Conductive Film) or non-conductive paste (NCP: Non Conductive Paste) may be used.

According to the first embodiment, since rounded portions 28 and 30 are formed on the periphery of active surface 10a and the rear surface 10b of the semiconductor device 61, stress concentration on the periphery of the semiconductor device 61 is mitigated, it is possible to improve the transverse strength, and it is possible to suppress damage to the semiconductor device 61.

In addition, a level difference portion 17 is formed on the periphery of the semiconductor device 61, in which a greater amount of adhesive as ACP, is arranged in comparison to other regions.

By this means, it is possible to obtain greater adhesive properties between the semiconductor device 61 and a circuit substrate, and to realize improving reliability.

Second Embodiment

An explanation of the second embodiment is provided hereafter, with reference to the drawings.

In the second embodiment, the first groove 20 is filled with resin, and a resin layer is formed into the first groove 20.

Therefore, the manufacturing process of the semiconductor device 61 of the second embodiment differs from the manufacturing process of the semiconductor device 61 of the first embodiment.

In the second embodiment, a detailed explanation is provided concerning the forming process of a resin layer into the first groove 20, and a process after the forming process of a resin layer within the first groove 20.

The same reference numerals are applied to construction components which are common to those of the semiconductor device 61 of the first embodiment, simplifying the explanation of other processes.

Electrode and First Groove Forming Processes

Figure 5A:
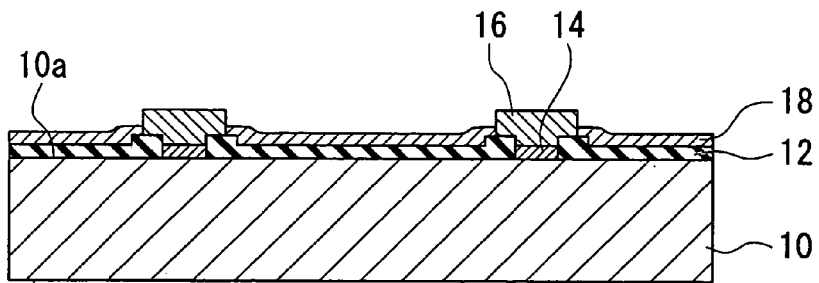
FIGS. 5A to 5E are cross-sectional views that show the manufacturing process of the semiconductor device according to the second embodiment.

First of all, as shown in FIG. 5A, electrode pad 14 is formed on the semiconductor wafer 10 on which a semiconductor element is formed on the active surface 10a, and a protruding electrode 16 is further formed on electrode pad 14.

Figure 5B:
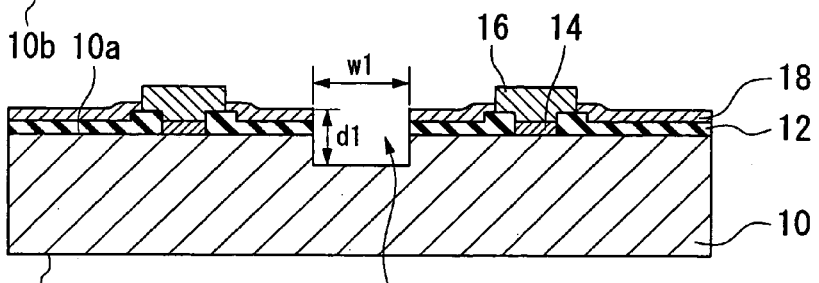

Next, as shown in FIG. 5B, dicing is performed to the cutting region S formed on the outer periphery of the semiconductor region 60 of the active surface 10a of the semiconductor wafer 10 by using a dicing blade or laser (not shown), and a first groove 20 is formed which does not penetrate the semiconductor wafer 10.

Resin Layer Filling Process

Figure 5C:
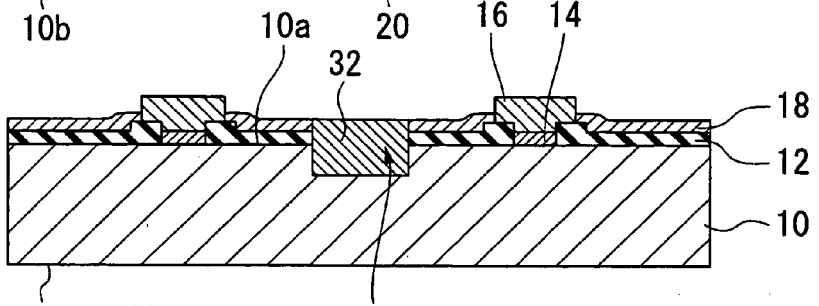

Next, as shown in FIG. 5C, resin is coated and filled within the first groove 20 by using the spin coating method or ink jet method and the similar. Therefore resin layer 32 is formed in the first groove 20.

In this instance, it is preferable that, in the resin layer filling process, epoxy resin having an ultra-violet ray curable resin or a low temperature heat curable resin and the similar, which are resistant to etching liquid (a mixture of hydrogen fluoride acid and nitric acid) at the time of spin etching, and other low temperature heat curable resins and the similar, be used as the resin material.

Connecting and Back Grind Processing

Figure 5D:
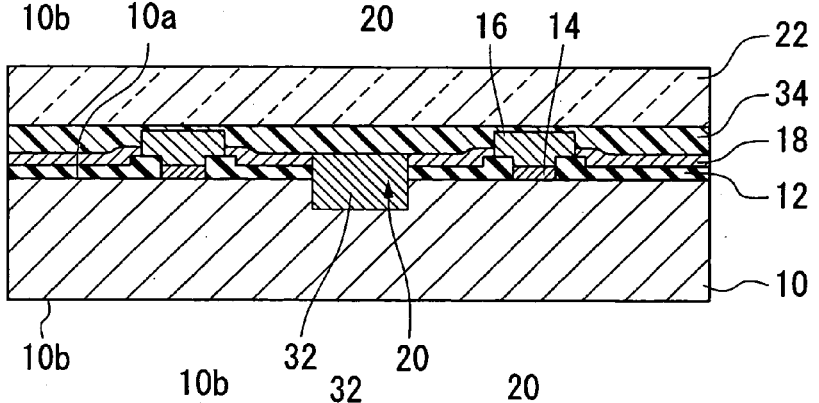

Next, as shown in FIG. 5D, a glass substrate 22 (support member) made of a transparent material is prepared, and an adhesive layer 34 is formed and attached to at least one of the active surface 10*a* of the semiconductor wafer 10 and a surface (surface facing the active surface 10*a*) of the glass substrate 22.

Subsequently, the active surface 10*a* of the semiconductor wafer 10 and the glass substrate 22 are connected together via adhesive layer 34.

Figure 5E:
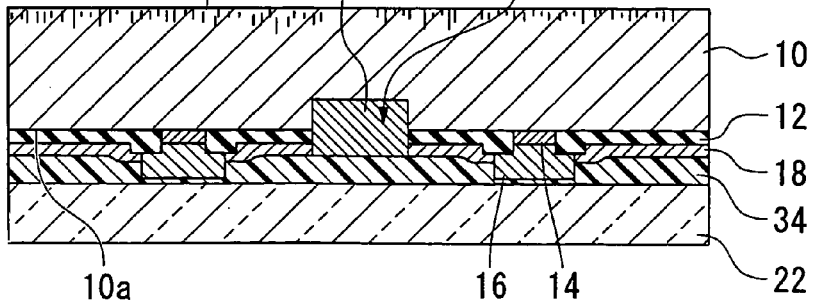

Next, as shown in FIG. 5E, the rear surface 10*b* of the semiconductor wafer 10 is ground, and the thickness of the semiconductor wafer 10 is decreased to a specified thickness.

At this time, during the back grinding process, minute cracks are formed on the rear surface 10*b* of the polished and ground semiconductor wafer 10, a damaged layer is formed on the rear surface 10*b* of the semiconductor wafer 10, as shown in FIG. 5E.

Second Groove Forming Process

Figure 6A:
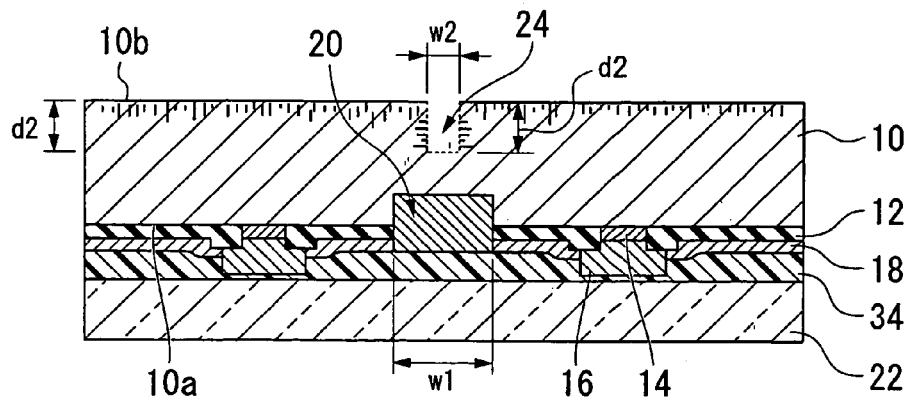
FIGS. 6A to 6D are cross-sectional views that show the manufacturing process of the semiconductor device according to the second embodiment.

Next, as shown in FIG. 6A, dicing is performed to the position of the rear surface 10*b* corresponding to the first groove 20 formed on the active surface 10*a*, using a dicing blade or laser (not shown).

By this means, a second groove 24 which does not reach the first groove 20 is formed on the rear surface 10*b*.

At this time, cracking is formed on the inner wall surface of the second groove 24, as shown FIG. 6A.

In addition, the width w2 of the second groove 24 formed on the rear surface 10*b* of the semiconductor wafer 10 is narrower than the width w1 of the first groove 20 formed on the active surface 10*a* of the semiconductor wafer 10.

Moreover, the width w1 of the first groove 20 and the width w2 of the second groove 24 may also be same width.

Isotropic Etching Process

Figure 6B:
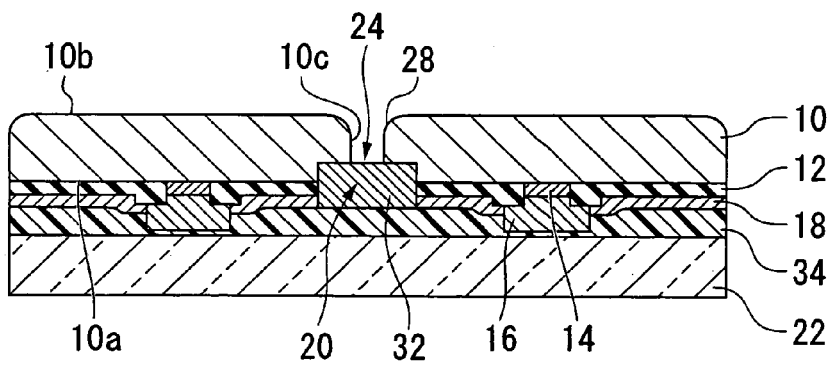

Next, as shown in FIG. 6B, wet etching (isotropic etching) is executed from the rear surface 10*b* of the semiconductor wafer 10.

By this means, the damaged layer formed on the rear surface 10*b* of the semiconductor wafer 10 is etched, and the inner wall surface of the second groove 24 is simultaneously etched.

By this means, the rear surface 10*b* including the inner wall surface of the second groove 24 of the semiconductor wafer 10 is etched, and the damaged layer of cracks and the similar is removed.

In the etching progresses, the material of the semiconductor wafer between the second groove 24 and the first groove 20 is removed, the resin layer 32 filled into the first groove 20 is exposed.

Since resin layer 32 is resistant to the etching liquid, resin layer 32 is not etched.

In addition, by performing the isotropic etching, a rounded portion 28 is formed in the corner portion (aperture entry angle of penetrating hole 26) including the end of the rear surface 10*b* of the semiconductor wafer 10 and the end of the cut surface 10*c* of the penetrating hole 26.

Moreover, in the isotropic etching process, a dry etching method may be adopted. In this case, the damaged layer formed on the rear surface 10*b* of the semiconductor wafer 10 is etched by executing dry etching (isotropic etching) from the rear surface 10*b* of the semiconductor wafer 10, as shown in FIG. 6B, and the inner wall surface of the second groove 24 is simultaneously etched.

By this means, etching the rear surface 10*b* including the inner wall surface of the second groove 24 of the semiconductor wafer 10 is performed, and the damaged layer of cracks and the similar is removed.

As etching progresses, the material of the semiconductor wafer between the second groove 24 and the first groove 20 is removed, the resin layer 32 filled into the first groove 20 is exposed.

Resin Layer Cutting Process

Figure 6C:
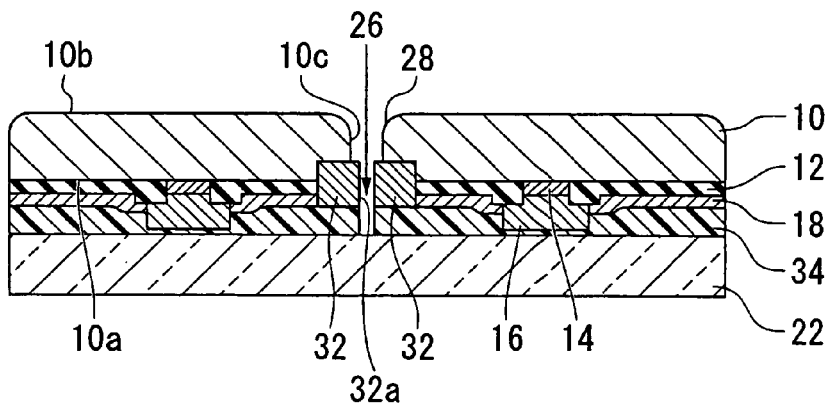

Next, as shown in FIG. 6C, the resin layer 32 is diced facing the first groove 20 from the second groove 24 by using a dicing blade or laser and the similar. The resin layer 32 is cut.

By this means, the semiconductor wafer 10 is diced along the cutting region S, each of semiconductor regions 60 is divided, and thereby the individual semiconductor devices are obtained.

At this time, by using a dicing blade having a blade width substantially uniform to the width of the second groove 24, the side surface 10*c* of the semiconductor device 61 and the side surface 32*a* of the resin layer 32 can be flattened.

Exfoliation Process

Figure 6D:
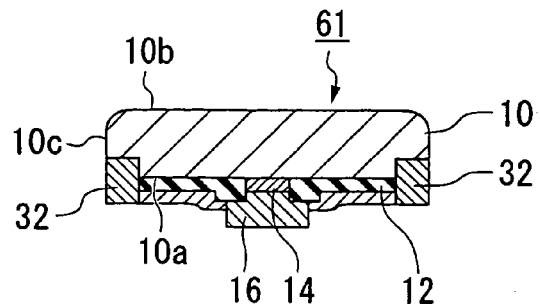

Next, as shown in FIG. 6D, interface exfoliation is generated in the adhesive layer 34 by radiating ultraviolet rays onto adhesive layer 34 so as to transmit the glass substrate 22, and the semiconductor wafer 10 is separated from the glass substrate 22.

Thereby, individual semiconductor devices 61 are obtained.

According to the second embodiment, after connecting the second groove 24 and the first groove 20, the resin layer 32 filled in the first groove 20 is exposed.

In this instance, resin layer 32 is not etched.

By this means, circulation of the etching liquid toward the active surface 10*a* of the semiconductor wafer 10 can be prevented. It is possible to protect the semiconductor element formed on the active surface 10*a* of the semiconductor wafer 10.

Semiconductor Device

An explanation of the semiconductor device manufactured by the manufacturing method for the semiconductor device of the second embodiment is provided hereafter.

Semiconductor device 61 of the second embodiment differs from the semiconductor device 61 of the first embodiment in the point that resin layer 32 is filled into the first groove 20.

In the second embodiment, construction components which are the same as those of the semiconductor device 61 of the first embodiment are given the same reference numerals, simplifying the explanation.

Figure 7A:
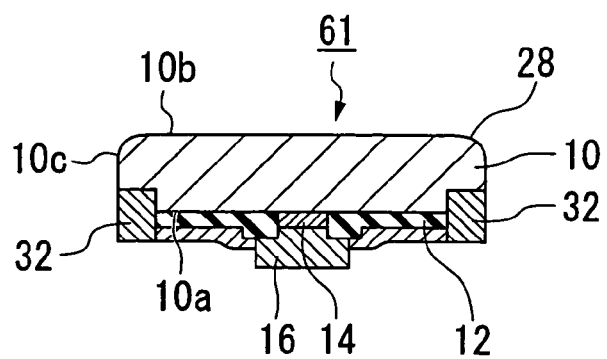
FIG. 7A is a cross-sectional view that schematically shows a semiconductor device.

FIG. 7A is a cross-sectional view that schematically shows the semiconductor device 61.

As shown in FIG. 7A, the corner portion (on the periphery of the rear surface 10*b* of the semiconductor device 61) including the end of the rear surface 10*b* and the end of the side surface 10c of the semiconductor device 61 is etched by the described isotropic wet etching, thereby the rounded portion 28 is formed.

In addition, since resin layer 32 is formed by filling resin into the first groove 20, there is a difference from the first embodiment in that there is no level difference portion formed on the periphery of the active surface 10a of the semiconductor device 61.

In other words, the side surface 10c of the semiconductor device 61 is composed from the silicon base body 10 and the resin layer 32.

Figure 7B:
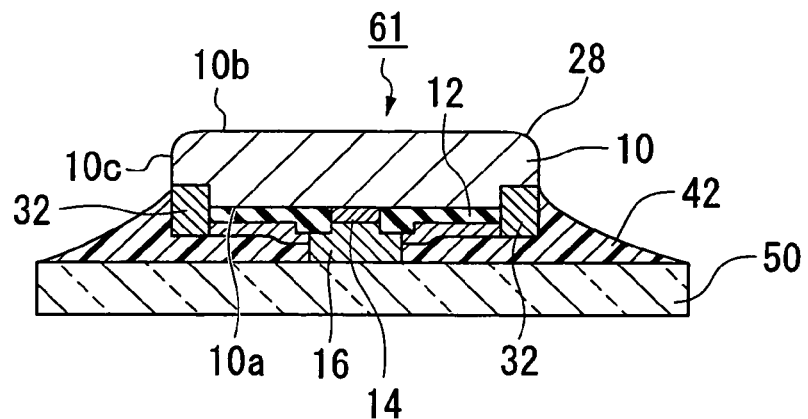
FIG. 7B is a cross-sectional view that schematically shows a semiconductor device packaged on a substrate.

FIG. 7B is a cross-sectional view that schematically shows a circuit substrate 50 on which the semiconductor device 61 of the second embodiment is packaged.

As shown in FIG. 7B, the semiconductor device 61 including the rounded portion 28 formed on the rear surface 10b, is packaged to the circuit substrate 50, for example, via an anisotropic conductive film (ACP). The active surface 10a is faced down (facedown) to the circuit substrate 50.

According to the second embodiment, since a rounded portion 28 is formed on the periphery of the rear surface 10b of the semiconductor device 61, the stress concentration on the periphery of the semiconductor device 61 is mitigated. It is possible to improve the transverse strength of and to suppress damage to the semiconductor device 61.

Third Embodiment

An explanation of this embodiment is provided next, with reference to the drawings.

In the manufacturing method for the semiconductor device 61 of the third embodiment, there is a difference in comparison with the manufacturing method for the semiconductor device 61 of the first embodiment, in the point that TEG is not formed in the respective cutting regions S of semiconductor regions 60 in the semiconductor wafer.

In the third embodiment, the same reference numerals are applied to and explanations omitted from processes and compositions which are the same as those of the first embodiment, and explanations are only provided for parts which differ from those of the first embodiment.

FIGS. 8A to 9C are cross-sectional views that show the forming of semiconductor devices 61 in which the semiconductor wafer 10 has been individualized for each semiconductor region 60.

Semiconductor Wafer

Figure 8A:
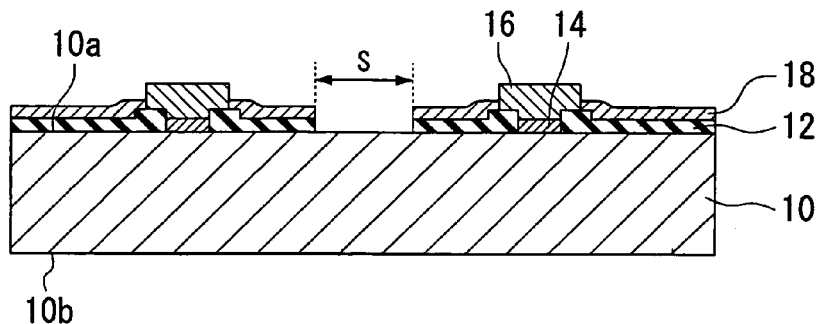
FIGS. 8A to 8C are cross-sectional views that show the manufacturing process of the semiconductor device according to the third embodiment.

First of all, an explanation is provided concerning semiconductor wafer 10 on which semiconductor regions 60 are formed, with reference to FIGS. 1 and 8A.

The semiconductor regions 60 are formed on the semiconductor wafer 10 made of silicon material.

A transistor, memory elements, and an accumulation circuit formed from other semiconductor elements are formed on the active surface 10a of each semiconductor region 60.

As shown in FIG. 8A, the insulation layer 12 and the protective resin layer 18 are laminated on the accumulation circuit.

The semiconductor regions 60 formed on the semiconductor wafer 10 are arranged side by side, and the area between each of the semiconductor regions 60 is cutting region S. The cutting region S is for cutting the semiconductor wafer 10 by the dicing blade or laser.

In this instance, in the first embodiment, the TEG for measuring the electrical characteristics of the semiconductor element is formed on the cutting region S. In the third embodiment, TEG, a test pattern, or the similar are not formed in the cutting region S.

Furthermore, as shown in FIG. 8A, since the insulation layer 12, the protective resin layer 18 and the similar that protect a TEG, are not formed on the cutting region S between the semiconductor regions 60, the semiconductor wafer 10 is exposed in the cutting region S.

Manufacturing Method for Semiconductor Device

Next, an explanation is provided of a manufacturing method for a semiconductor device.

Semiconductor Region Forming Process

First of all, as shown in FIG. 8A, the semiconductor regions 60 are formed on the active surface 10a of the semiconductor wafer 10.

In the cutting region S between the semiconductor regions 60, the TEG, the wiring, the insulation layer, the protective resin layer, and the similar are not formed. The surface of the semiconductor wafer is exposed in a position corresponding to the cutting region S.

Since the TEG, the insulation layer 12, or the protective resin layer 18 are not formed on the cutting region S, a groove is formed on the cutting region S.

Therefore, in third embodiment, since it is unnecessary that cutting the TEG formed between the semiconductor regions 60, and cutting the insulation layer 12 and the protective resin layer 18 covering the TEG, the first groove forming process explained in the first embodiment can be omitted.

Connecting Process for Semiconductor Wafer And Glass Substrate

Figure 8B:
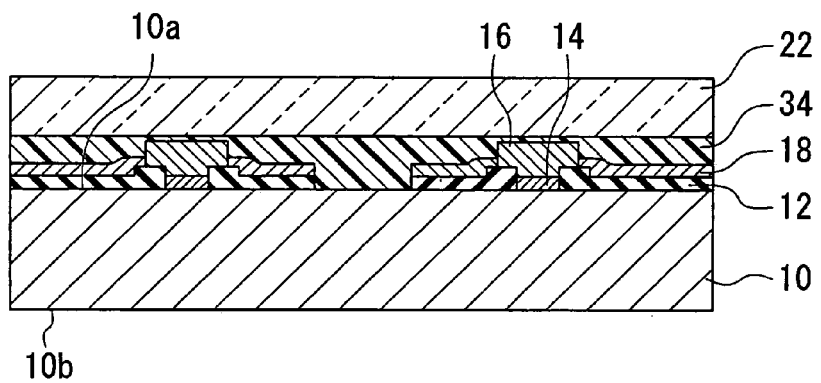

Next, as shown in FIG. 1 and FIG. 8B, a semiconductor wafer 10 on which the semiconductor regions 60 are formed, and the glass substrate 22 are connected together via adhesive layer 34.

Adhesive layer 34 is also arranged in the cutting region S groove between semiconductor regions 60.

As the adhesive layer 34, ultra-violet ray curable epoxy resin and acrylic resin may be optimal used.

Back Grinding Process

Figure 8C:
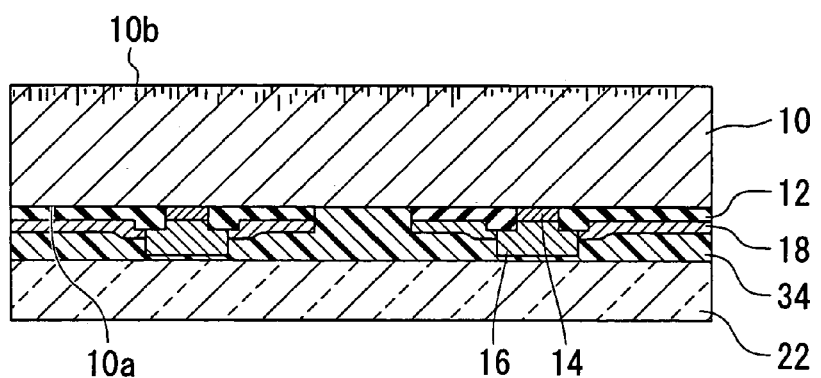

Next, as shown in FIG. 8C, back grinding is performed to the rear surface 10b of the semiconductor wafer 10.

In the back grind process, grinding is performed so that the thickness of the semiconductor wafer 10 becomes a specified thickness.

At this time, a damaged layer is formed by back grinding the rear surface 10b of the semiconductor wafer 10.

Groove Forming Process

Figure 9A:
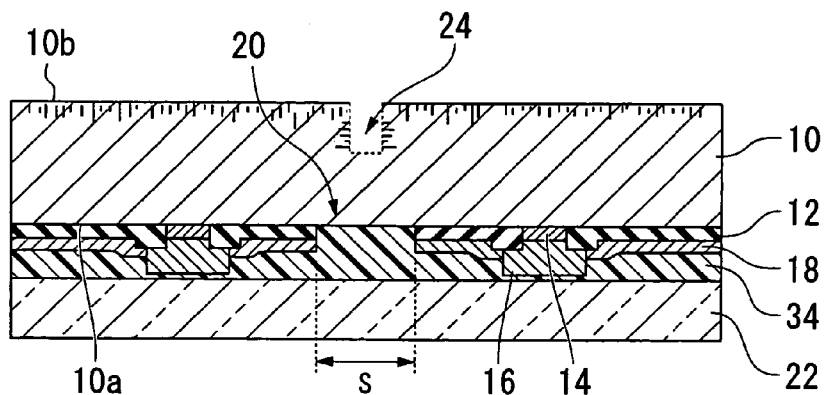
FIGS. 9A to 9C are cross-sectional views that show the manufacturing process of the semiconductor device according to the third embodiment.

Next, as shown in FIG. 9A, dicing is performed by positionally aligning a dicing blade or laser (not shown) on the cutting region S between the semiconductor regions 60 formed on the active surface 10a of the semiconductor wafer 10.

At this time, it is preferable that the blade width of the dicing blade and the laser irradiation area desirably have a width which is narrower than the width of the cutting region S between the semiconductor regions 60.

By this means, since it would be well if the dicing blade and laser irradiation area were positionally aligned within the parameters of the width of the cutting region S, slight positional slippage is allowed, simplifying positional alignment precision at the time of forming a groove.

Isotropic Etching Process

Figure 9B:
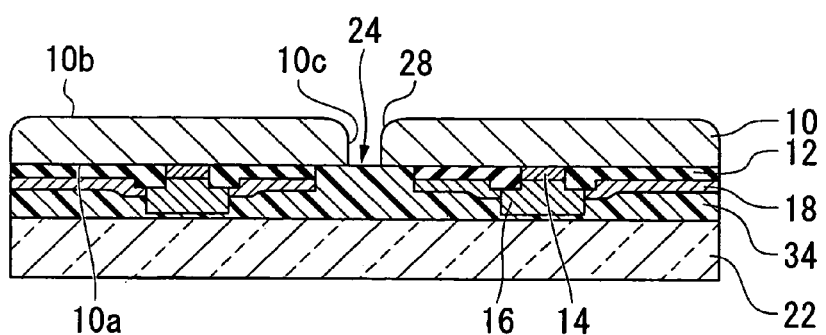

Next, as shown in FIG. 9B, by executing wet etching (isotropic etching) from the rear surface 10b of the semiconductor wafer 10, the damaged layer formed on the rear surface 10b of the semiconductor wafer 10 can be etched, and the inner wall surface (including the damaged layer) of the groove 24 can be simultaneously etched.

In the wet etching, it is preferable that the spin etching method be used.

As etching progresses, the bottom surface and inner wall surface of groove 24 is dissolved, the bottom surface of the groove 24 reaches to the cutting region S mutually formed between the semiconductor regions 60, and the penetrating hole 26 connecting the active surface 10a and the rear surface 10b of the semiconductor wafer layer 10 is formed.

By this etching process, the thickness of the semiconductor wafer 10 is decreased, and the semiconductor wafer 10 is diced along the cutting region S.

Each of semiconductor regions 60 is divided.

Thereby, the individual semiconductor devices 61 are obtained.

In addition, by performing the isotropic etching, a rounded portion 28 is formed in the corner portion (angle of the aperture intake opening of the penetrating hole 26) including the end of the rear surface 10b of the semiconductor wafer 10 and the end of the cut surface 10c of the penetrating hole 26.

Moreover, in the isotropic etching process, the dry etching (isotropic etching) method may be adopted.

In the case of adopting dry etching, as shown in FIG. 9B, by performing the isotropic etching from the rear surface 10b of semiconductor wafer 10, the damaged layer formed on the rear surface 10b of the semiconductor wafer 10 is etched.

In addition, the inner wall surface (including the damaged layer) of the groove 24 is simultaneous etched.

In the case of the dry etching, it is preferable that etching gas be a fluorine type gas.

As etching progresses, the bottom surface and inner wall surface of the groove 24 is etched, the bottom surface of the groove 24 reaches to the cutting regions S mutually formed between the semiconductor regions 60, and the penetrating hole 26 connecting the active surface 10a of the semiconductor wafer 10 to the rear surface 10b is formed.

By performing the etching process, the thickness of the semiconductor wafer 10 is decreased, the semiconductor wafer 10 is diced along the cutting region S, each of the semiconductor regions 60 are divided, and thereby the individual semiconductor devices 61 are obtained.

In addition, by the isotropic etching, a rounded portion 28 is formed in the angle (angle of the aperture entry of the penetrating hole 26) including the end of the rear surface 10b of the semiconductor wafer 10 and the end of the cut surface 10c of the penetrating hole 26.

Exfoliation Process

Figure 9C:
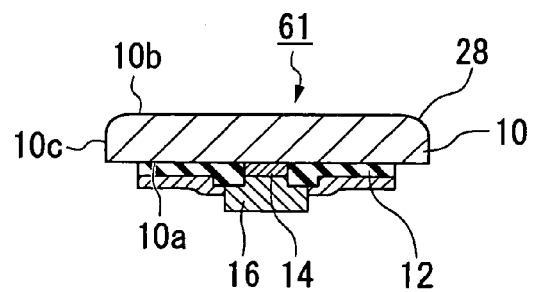

Next, as shown in FIG. 9C, interface exfoliation is generated in the adhesive layer 34 by irradiating ultraviolet rays onto adhesive layer 34 so as to transmit the glass substrate 22, the semiconductor wafer 10 is separated from the glass substrate 22.

By this means, the individualized semiconductor devices 61 can be obtained.

It is preferable that the method of the third embodiment be used in the case in which a TEG pattern is not formed in the mutual cutting regions S of the semiconductor region 60 in the semiconductor wafer 10.

According to the third embodiment, since the forming process of the first groove in the first embodiment and the second embodiment can be omitted, the manufacturing process can be simplified.

Other effects are the same as those of the first embodiment.

Laminated Semiconductor Device

Figure 10:
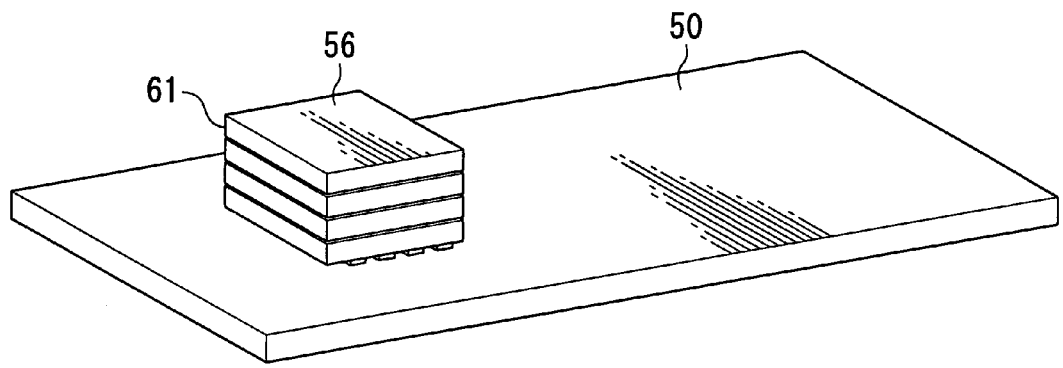
FIG. 10 is a perspective view that schematically shows a plurality of accumulated layers of semiconductor devices on a circuit substrate.

FIG. 10 explains a laminated semiconductor device in which the semiconductor devices 61 are laminated.

As shown in FIG. 10, the semiconductor device 61 is packaged on circuit substrate 50.

The circuit substrate 50 is made of an organic type substrate, for example, a glass epoxy substrate and the similar.

On circuit substrate 50, wiring patterning (not shown) made of, for example, copper and the similar are formed so as to form a desired circuit.

A pad (not shown) is connected to the wiring pattern.

The solder ball of the semiconductor device 61 is connected to the pad.

By this means, the semiconductor device 61 is packaged on the circuit substrate 50.

In this embodiment, a laminated semiconductor device 56 having a plurality of semiconductor devices 61 laminated each other, is packaged on the circuit substrate 50.

In the forming method for the laminated semiconductor device 56, the semiconductor devices 61 are laminated by solidifying (hardening) the solder layer after melting the solder layer by using a bonding tool as the heat source.

Moreover, an insulative resin as underfill (not shown) may also be filled between the laminated semiconductor devices 61.

In addition, at the time of laminating semiconductor devices 61, the semiconductor devices 61 may be laminated one layer by one layer, and the semiconductor devices 61 may also be laminated together by using reflow.

Electronic Device

Next, an explanation is provided of an example of this invention.

Figure 11:
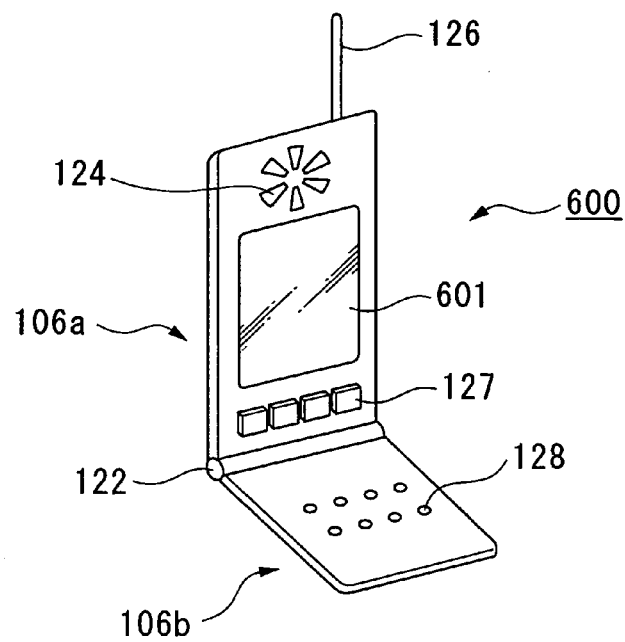
FIG. 11 is a perspective view that schematically shows the composition of a portable telephone.

FIG. 11 is a perspective view that shows a portable telephone (electronic device) provided with the described semiconductor device 61 or the laminated semiconductor device 56.

As shown in FIG. 11, portable telephone device 60 is provided with a foldable first body 106a and a second body 106b, in which a hinge 122 serves as the center of the first body 106a and the second body 106b.

On the first body 106a is provided a liquid crystal device 601, a plurality of operation buttons 127, an earpiece 124, and an antenna 126.

In addition, on the second body 106b is provided a mouthpiece.

Since, as indicated, this embodiment has high strength, the thinned semiconductor device 61 or the laminated semiconductor device 56, a miniaturized electronic device having improved reliability can be provided.

Moreover, the semiconductor device 61 of this embodiment can be applied to various electronic devices other than portable telephones.

For example, liquid crystal projectors, multi-media personal computers (PC), engineering workstations (EWS), pagers, word processors, televisions, videotape recorders of viewfinder and direct view types, electronic notebooks, car navigation devices, POS terminals, and touch panels and the similar may be applied for the electronic devices.

In addition, the invention is not limited to these examples, but various changes may be added within the scope of the subject matter in the invention.

In addition, combinations of each example may be used within the scope of the subject matter in the invention.

In addition, in the second groove forming process of the above described embodiment, the second groove 24 may be penetrated to the first groove 20, and dicing may also be performed in the process before the etching process.

In the above described embodiment, after the formation of the groove 20 on the active surface 10a of the semiconductor wafer 10, the active surface 10a of the semiconductor wafer 10 is faced to the glass substrate 22, and the semiconductor wafer 10 and the glass substrate 22 are connected together via the adhesive layer 34.

In this regard, back grinding may be performed to the rear surface 10b of the semiconductor wafer 10 without connecting the glass substrate 22 to the semiconductor wafer 10.

Furthermore, in the above described embodiment, the semiconductor wafer 10 is thinned by back grinding the rear surface 10b on the opposite side of the active surface 10a of the semiconductor wafer 10.

In the case of advance preparation of a thinned semiconductor wafer 10, the back grind processing may be omitted.

In addition, in the above described embodiment, the end of the dicing blade 38 may be also formed a groove or second groove using a rectangular or circular shape.

Figure 12:
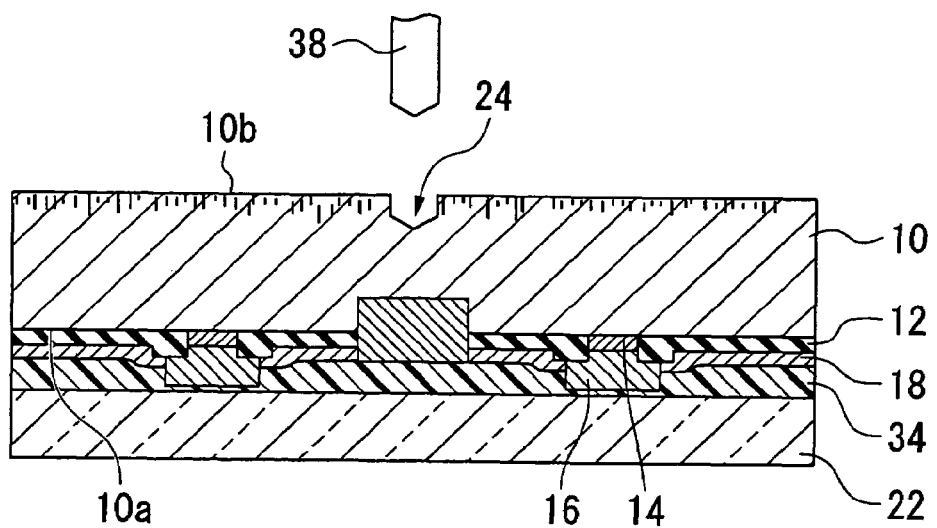
FIG. 12 is a cross-sectional view that shows the second groove forming process.

As shown in FIG. 12, it is preferable that the shape of the end of the dicing blade is tapered (the shape of the end of the dicing blade is V-formation in the cross-sectional view), thereby it is possible to suppress the generation of cracking or chipping in the dicing processing.

In addition, by using the dicing blade having the end tapered, the groove of the semiconductor wafer 10 may also be formed into a tapered shape, corresponding to the shape of the end of the dicing blade.

Furthermore, by etching the groove having a tapered shape in the cross-sectional view, in comparison to the case in which using a dicing blade having an end formed rectangular or circular, the cornet portion of the semiconductor device 61 can be easily curved.

By this means, since a rounded portion 28 can be easily formed on the periphery of the rear surface 10b of the semiconductor device 61, stress concentration on the periphery of the semiconductor device 61 can be mitigated, the transverse strength of and suppressing damage to the semiconductor device 61 can be improved.

What is claimed is:

1. A manufacturing method for a semiconductor device, comprising:
    preparing a semiconductor wafer having an active surface and a rear surface on an opposite side of the active surface;
    forming a plurality of semiconductor regions, each of which having semiconductor elements formed on the active surface of the semiconductor wafer;
    forming cutting regions on the outer periphery of the semiconductor regions on the active surface of the semiconductor wafer;
    forming, on the cutting region, a first groove which does not penetrate the semiconductor wafer;
    forming, on the rear surface of the semiconductor wafer, a second groove which does not penetrate to the first groove in the position corresponding to the cutting region;
    decreasing a thickness of the semiconductor wafer, connecting the first groove and the second groove, and dividing each of the semiconductor regions from the semiconductor wafer by executing isotropic etching to the rear surface of the semiconductor wafer; and
    obtaining a plurality of individual semiconductor devices.

2. The manufacturing method for the semiconductor device according to claim 1, further comprising:
    facing the active surface of the semiconductor wafer and a support member supporting the semiconductor wafer after the forming of the first groove; and
    connecting the active surface of the semiconductor and the support member via an adhesive layer.

3. The manufacturing method for the semiconductor device according to claim 2, wherein the adhesive layer is formed from material which is cured by irradiation of ultraviolet rays.

4. The manufacturing method for the semiconductor device according to claim 2, wherein the adhesive layer is formed from material which is caused to foam by irradiation of ultraviolet rays.

5. The manufacturing method for the semiconductor device according to claim 2, wherein the adhesive layer is formed from material which is caused to foam by heating.

6. The manufacturing method for the semiconductor device according to claim 2, wherein the adhesive layer is formed from resin material which is soluble in a solvent.

7. The manufacturing method for the semiconductor device according to claim 2, wherein the support member is formed from material transmitted by ultraviolet rays.

8. The manufacturing method for the semiconductor device according to claim 1, further comprising:
    executing back grinding to the rear surface of the semiconductor wafer after the forming of the first groove.

9. The manufacturing method for the semiconductor device according to claim 1, wherein the isotropic etching is spin etching in which etching liquid is dripped onto the rear surface of the semiconductor wafer while rotating the semiconductor wafer.

10. The manufacturing method for the semiconductor device according to claim 1, wherein the isotropic etching is dry etching.

11. The manufacturing method for the semiconductor device according to claim 1, wherein a width of the second groove is narrower than a width of the first groove.

12. The manufacturing method for the semiconductor device according to claim 1, wherein the first groove and second groove are formed by using a dicing blade of which end is tapered.

13. The manufacturing method for the semiconductor device according to claim 1, wherein the first groove and second groove are formed by irradiating the semiconductor wafer with a laser.

14. A manufacturing method for a semiconductor device, comprising:
    preparing a semiconductor wafer having an active surface and a rear surface on an opposite side of the active surface;
    forming a plurality of semiconductor regions, each of which having semiconductor elements formed on the active surface of the semiconductor wafer;
    forming cutting regions on the outer periphery of the semiconductor regions on the active surface of the semiconductor wafer;
    forming, on the cutting region, a first groove which does not penetrate the semiconductor wafer;
    forming a resin layer by filling resin into the first groove;
    forming, on the rear surface of the semiconductor wafer, a second groove which does not penetrate to the first groove in the position corresponding to the cutting region;
    decreasing a thickness of the semiconductor wafer and exposing the resin layer by executing isotropic etching to the rear surface of the semiconductor wafer;
    dividing each of the semiconductor regions from the semiconductor wafer by cutting the resin layer from the second groove; and
    obtaining a plurality of individual semiconductor devices.

15. The manufacturing method for the semiconductor device according to claim 14, further comprising:
    facing the active surface of the semiconductor wafer and a support member supporting the semiconductor wafer after the forming of the first groove; and connecting the active surface of the semiconductor and the support member via an adhesive layer.

16. The manufacturing method for the semiconductor device according to claim 15, wherein the adhesive layer is formed from material which is cured by irradiation of ultraviolet rays.

17. The manufacturing method for the semiconductor device according to claim 15, wherein the adhesive layer is formed from material which is caused to foam by irradiation of ultraviolet rays.

18. The manufacturing method for the semiconductor device according to claim 15, wherein the adhesive layer is formed from material which is caused to foam by heating.

19. The manufacturing method for the semiconductor device according to claim 15, wherein the adhesive layer is formed from resin material which is soluble in a solvent.

20. The manufacturing method for the semiconductor device according to claim 15, wherein the support member is formed from material transmitted by ultraviolet rays.

21. The manufacturing method for the semiconductor device according to claim 14, further comprising:
executing back grinding to the rear surface of the semiconductor wafer after the forming of the first groove.

22. The manufacturing method for the semiconductor device according to claim 14, wherein the isotropic etching is spin etching in which etching liquid is dripped onto the rear surface of the semiconductor wafer while rotating the semiconductor wafer.

23. The manufacturing method for the semiconductor device according to claim 14, wherein the isotropic etching is dry etching.

24. The manufacturing method for the semiconductor device according to claim 14, wherein a width of the second groove is narrower than a width of the first groove.

25. The manufacturing method for the semiconductor device according to claim 14, wherein the first groove and second groove are formed by using a dicing blade of which end is tapered.

26. The manufacturing method for the semiconductor device according to claim 14, wherein the first groove and second groove are formed by irradiating the semiconductor wafer with a laser.

27. A manufacturing method for a semiconductor device, comprising:
preparing a semiconductor wafer having an active surface and a rear surface on an opposite side of the active surface;
forming a plurality of semiconductor regions, each of which having semiconductor elements formed on the active surface of the semiconductor wafer;
forming cutting regions on the outer periphery of the semiconductor regions on the active surface of the semiconductor wafer;
forming, on the cutting region, a groove which does not penetrate the semiconductor wafer;
decreasing a thickness of the semiconductor wafer and dividing each of the semiconductor regions from the semiconductor wafer by executing isotropic etching to the rear surface of the semiconductor wafer; and
obtaining a plurality of individual semiconductor devices.

28. A manufacturing method for the semiconductor device according to claim 27, wherein the groove is formed by using a dicing blade of which end is tapered.

29. The manufacturing method for the semiconductor device according to claim 27, wherein the groove is formed by irradiating the semiconductor wafer with a laser.

* * * * *